United States Patent [19]

Cornu et al.

[11] Patent Number: 4,560,926
[45] Date of Patent: Dec. 24, 1985

[54] CONTACT DEVICE FOR USE IN THE TESTING OF PRINTED CIRCUITS AND A REMOVABLE CONTACT HEAD FOR USE IN SUCH A DEVICE

[75] Inventors: Roger Cornu, Aigle; Pierre-André Meier, Antagnes, both of Switzerland

[73] Assignee: Technobal S.A., Aigle, Switzerland

[21] Appl. No.: 455,524

[22] Filed: Jan. 4, 1983

[30] Foreign Application Priority Data

Jan. 8, 1982 [CH] Switzerland .............................. 88/82

[51] Int. Cl.$^4$ ................................................ G01R 1/06
[52] U.S. Cl. ................................ 324/158 P; 324/72.5; 339/108 TP
[58] Field of Search ........................ 329/158 P, 72.5; 200/275, 280, 281, 290; 339/108 TP, 255 R

[56] References Cited

U.S. PATENT DOCUMENTS

| 3,435,168 | 3/1969 | Cooney | 200/275 |
| 3,799,168 | 3/1974 | Peters | 339/108 TP |
| 4,050,762 | 9/1977 | Hines et al. | 339/108 TP |
| 4,438,397 | 3/1984 | Katz | 324/158 P |

FOREIGN PATENT DOCUMENTS

| 1765461 | 7/1971 | Fed. Rep. of Germany | 339/108 TP |
| 2924262 | 2/1981 | Fed. Rep. of Germany | 324/158 F |
| 589947 | 7/1977 | Switzerland | 324/158 P |

OTHER PUBLICATIONS

A. Till, "Contact Probe," *IBM Tech. Disc. Bulletin*, vol. 16, No. 10, Mar. 1974, p. 3224.

*Primary Examiner*—Stewart J. Levy
*Assistant Examiner*—Stephen M. Baker
*Attorney, Agent, or Firm*—Peter L. Berger

[57] ABSTRACT

The contact device for testing printed circuits comprises a contact head (15) mounted for axial sliding motion in a guide tube (9) against the action of a coiled compression spring housed in the tube, and a seating member (8) carrying the tube and intended to be permanently fitted in an aperture provided in a plate forming part of a machine for testing printed circuits. The guide tube is fixedly secured to one end of the seating member. The spring has one end portion (12) fixedly secured to the guide tube adjacent the seating member and/or to said one end of the seating member, the opposite end portion (16) of the spring being formed with a plurality of mutually contacting turns (17), the outer diameter of the spring turns being less than the inner diameter of the tube. Finally, the contact head is removably secured to the opposite end portion (16) of the spring and is provided to this end with a smooth, cylindrical, retaining end portion (18) formed with a tapering engagement tip (20) and having a diameter very slightly greater than the inner diameter of the turns at the opposite end portion (16) of the spring.

3 Claims, 3 Drawing Figures

CONTACT DEVICE FOR USE IN THE TESTING OF PRINTED CIRCUITS AND A REMOVABLE CONTACT HEAD FOR USE IN SUCH A DEVICE

BACKGROUND OF THE INVENTION

This invention relates to contact devices for use in the testing of printed circuits.

Machines used in the electronic industry for testing printed circuits generally comprise a plate through which extend apertures in well defined positions. These apertures are intended to accommodate contact devices for carrying out electrical measurements at particular points of a printed circuit card positioned parallel to the plate.

To this end, the contact devices used so far each comprise a seating member intended to be permanently mounted in one of the apertures of the plate, which seating member serves firstly mechanically to hold in position the contact head to the side of the plate intended to face the printed circuit card, and secondly electrically to connect the contact head with the testing system as such.

The seating member is generally formed by a receptacle in which is removably mounted an interchangeable assembly or unit comprising of a guide tube, a coiled compression spring housed in the tube and a contact head projecting from one end of the tube and adapted axially to slide in the tube against the action of the spring.

The operative portion of the contact head varies considerably in shape depending on the nature of the printed circuit areas where measurements are to be made.

Interchangeable assemblies or units are awkward to manufacture and assemble because of the simultaneous inclusion of the guide tube, of the compression spring and of the contact head. It is therefore not rational to use such assemblies.

BRIEF SUMMARY OF THE INVENTION

The invention provides a novel test contact device in which only the contact head is removable, the other components remaining permanently in the apertures of the testing machine plate.

Thus, according to one aspect of the invention there is provided a contact device for use in the testing of printed circuits, comprising a guide tube, a coiled compression tube housed in the tube, a contact head mounted for axial sliding motion in the tube against the action of the spring, and a seating member carrying the tube and adapted to be permanently mounted in an aperture provided in a part of a machine for testing printed circuits, wherein:

the guide tube is fixedly secured to the seating member;
the spring has one end portion fixedly secured adjacent
  the seating member, the other end portion of the spring being formed with a plurality of mutually contacting turns and the turns of the spring having an outer diameter less than the inner diameter of the tube; and
the contact head is removably secured to said other end portion of the spring and comprises therefor a smooth, cylindrical, retaining end portion having a tapering engagement tip and having a diameter very slightly greater than the inner diameter of the turns at said other end portion of the spring whereby the contact head may readily be engaged in the tube or withdrawn therefrom by subjection of the contact head to a rotary movement in the same direction as the spring turns.

According to another aspect of the invention there is also provided for use in the above contact device, a contact head comprising a smooth, cylindrical, retaining end portion having a tapering engagement tip.

BRIEF DESCRIPTION OF THE DRAWINGS

For a better understanding of the invention reference will now be made to the accompanying drawings, in which.

DETAILED DESCRIPTION OF THE PREFERRED EMBODIMENTS

Figure 1:
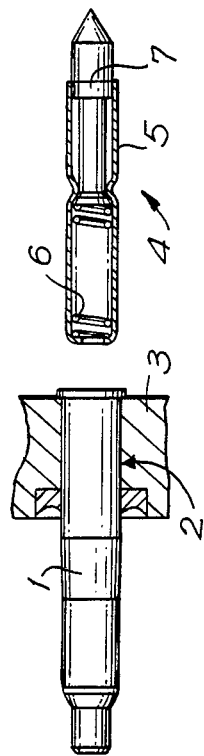
FIG. 1 is a cross-sectional view of a known contact device.

The known contact device shown in FIG. 1 comprises a seating member 1 intended to be permanently mounted in a passage 2 extending through a plate 3 provided in the testing machine. The seating member 1 is arranged removably to receive an interchangeable assembly or unit 4 consisting of a guide tube 5, at least one coiled compression spring 6 housed in the tube, and a contact head 7 projecting from one end of the tube.

Figure 2:
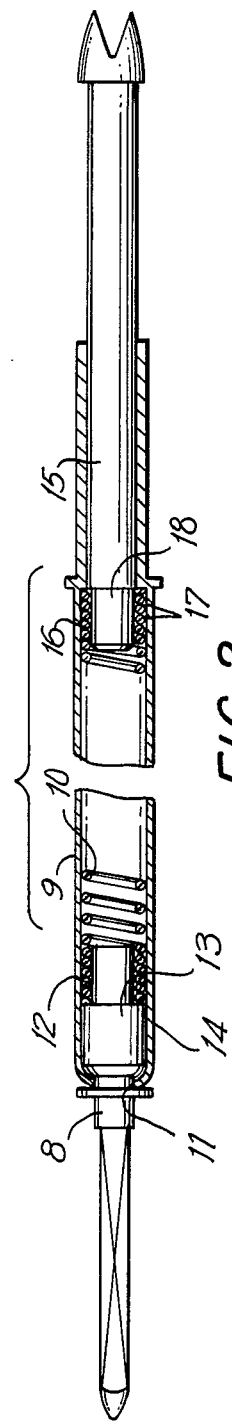
FIG. 2 is a cross-sectional view of a contact device according to the invention.

In the novel FIG. 2 arrangement, a unit is provided comprising a seating member 8, a guide tube 9 and a coiled compression spring 10.

In this embodiment one end portion of the guide tube 9 is crimped into a groove 11 provided in the seating member 8 with one end portion 12 of spring 10 engaging over an end portion 13 of seating member 8 where it is fixedly secured in position by a four point crimping of the adjacent portion 14 of tube 9.

As for the contact head 15 it is removably secured to the other end portion 16 of the spring.

Figure 3:
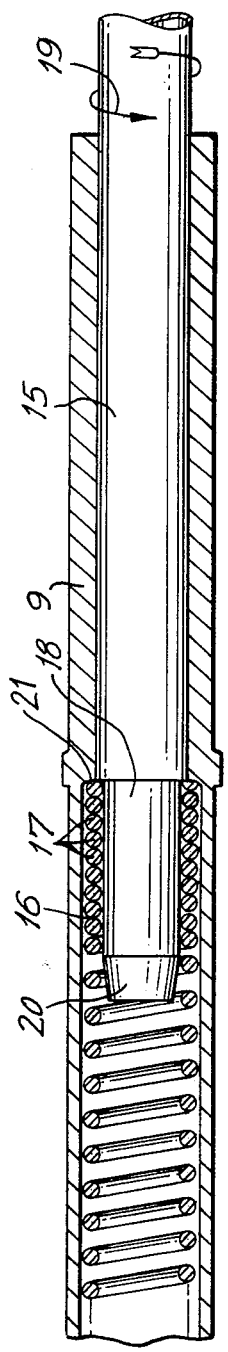
FIG. 3 is an enlarged sectional view of a portion of FIG. 2.

As will best be seen in FIG. 3, the end portion 16 comprises a plurality of mutually contacting turns 17 having an outer diameter less, e.g. by 0.05 mm, than the inner diameter of tube 9.

Further, the contact head 15 is provided with a smooth, cylindrical, retaining end portion 18 having a diameter slightly greater, e.g. by 0.02 mm, than the inner diameter of the turns 17.

Thus, to engage the retaining end portion 18 into the end portion 16 of spring 10 or to withdraw the retaining end portion 18 from the end portion 16 of spring 10, it will suffice to carry out, during engagement or withdrawal, a rotary movement in a direction opposite to that of the turns as indicated by the arrow 19, as this will have the effect of opening up the turns 17 of spring 10. To facilitate engagement, the retaining end portion 18 is formed with a tapered engagement tip 20.

The inner surface of the tube is formed with a sloping shoulder 21 against which bears the final turn of the end portion 16 of spring 10. This shoulder serves to tighten this final turn against the retaining end portion 18 and hence to assist in holding the contact head 15 so long as it is not urged inwardly of the tube 9.

Various modifications may be made to the illustrated embodiment. For instance, the free end of the seating member may be adapted to enable any kind of electrical connection with the testing system, in particular by winding or by soldering. Further, all of the parts of the contact device may be so sized as to suit the particular uses being envisaged, or to be provided with any kind of suitable cladding.

What is claimed is:

1. A contact device for use in the testing of printed circuits comprising a guide tube, a coiled compression spring housed in the tube, a contact head mounted for axial sliding motion in the tube against the action of the spring, and a seating member carrying the tube, wherein:

the guide tube is fixedly secured to the seating member, the spring has one end portion fixedly secured adjacent the seating member, the other end portion of the spring being formed with a plurality of mutually contacting turns and the turns of the spring having an outer diameter less than the inner diameter of the guide tube, said other end portion having a final turn; and the contact head is removably secured to said other end portion of the spring and comprises therefrom a smooth cylindrical, retaining end portion having a tapering engagement tip, the inside surface of the guide tube being formed with a sloping shoulder against which bears said final turn to tighten said final turn against said retaining end protion of the contact head when the latter is not urged inwardly of the tube, said retaining end portion having a diameter very slightly greater than the inner diameter of the turns at said other end portion of the spring whereby the contact head may readily be engaged in the tube or withdrawn therefrom by subjection of the contact head to a rotary movement in a direction opposite to that of the spring turns to engage or disengage said retaining end from said other end portions of the spring.

2. A contact device as claimed in claim 1, wherein the retaining end portion of the contact head has a diameter greater by about 0.02 mm than the inner diameter of the spring turns.

3. A contact device as claimed in claim 1, wherein the seating member has a groove into which the guide tube is crimped, and wherein the seating member has an end portion over which said one end portion of the spring is engaged, said one end portion of the spring being fixedly secured by crimping of the guide tube.

* * * * *